(12) United States Patent
Kang

(10) Patent No.: US 6,727,876 B2
(45) Date of Patent: Apr. 27, 2004

(54) TFT LCD DRIVER CAPABLE OF REDUCING CURRENT CONSUMPTION

(75) Inventor: Chang-sig Kang, Yongin (KR)

(73) Assignee: Samsung Electronics Co., Ltd. (KR)

( * ) Notice: Subject to any disclaimer, the term of this patent is extended or adjusted under 35 U.S.C. 154(b) by 422 days.

(21) Appl. No.: 09/956,746

(22) Filed: Sep. 18, 2001

(65) Prior Publication Data

US 2002/0089476 A1 Jul. 11, 2002

(30) Foreign Application Priority Data

Jan. 6, 2001 (KR) ............................................ 2001-843

(51) Int. Cl.$^7$ ................................................. G09G 3/36
(52) U.S. Cl. ......................................... 345/92; 345/87
(58) Field of Search .............................. 345/90, 91, 92, 345/93, 94, 95, 96, 97, 98, 99, 100, 104; 349/42

(56) References Cited

U.S. PATENT DOCUMENTS

| | | | |
|---|---|---|---|
| 5,583,535 A | * 12/1996 | Takarada et al. | 345/99 |
| 6,160,533 A | * 12/2000 | Tamai et al. | 345/89 |
| 6,232,946 B1 | * 5/2001 | Brownlow et al. | 345/98 |
| 6,266,041 B1 | * 7/2001 | Cairns et al. | 345/100 |
| 6,437,767 B1 | * 8/2002 | Cairns et al. | 345/100 |
| 2001/0005196 A1 | * 6/2001 | Ishii | 345/100 |

FOREIGN PATENT DOCUMENTS

KR 1998-067312 10/1998 ............ G09G/3/36

* cited by examiner

*Primary Examiner*—Vijay Shankar
*Assistant Examiner*—Nitin Patel
(74) *Attorney, Agent, or Firm*—Mills & Onello, LLP

(57) ABSTRACT

A thin film transistor (TFT) liquid crystal device (LCD) driver capable of reducing current consumption is provided. The TFT LCD driver includes a gate driver for driving gate lines of a panel formed of a plurality of transistors and capacitors, and a source driver for driving source lines of the panel. The source driver includes a shift register portion, a latch clock signal generating portion, and a data latching portion. The shift register portion includes first through n-th flip-flops, into which a multiplied signal of an external clock signal is input as a clock signal, and input and output terminals of the flip-flops are connected in series, and provides a driving pulse signal as an input signal of the first flip-flop in response to the clock signal. The latch clock signal generating portion generates first through n-th latch clock signals by logically multiplying first through n-th middle driving pulse signals generated by the corresponding first through n-th flip-flops by inverted signals of first through n-th output signals. The data latching portion receives data signals and includes first through n-th latches for latching and outputting the data signals in response to the corresponding first through n-th latch clock signals. Current consumed by the driver is reduced by the TFT LCD driver.

4 Claims, 5 Drawing Sheets

TFT LCD DRIVER CAPABLE OF REDUCING CURRENT CONSUMPTION

BACKGROUND OF THE INVENTION

1. Field of the Invention

The present invention relates to a thin film transistor (TFT) liquid crystal display (LCD), and more particularly, to a TFT LCD driver capable of reducing current consumption in a TFT LCD driver for driving a panel of a TFT LCD.

2. Description of the Related Art

Generally, a TFT LCD includes a gate driver for driving TFT gate lines (or row lines) and a source driver for driving TFT source lines (or column lines) in order to drive a TFT LCD panel. The gate driver provides a high voltage to the TFT LCD, and turns on the TFT. The source driver provides source driving signals to each of the source lines in order to indicate a color in the respective source lines, and displays a picture in an LCD. The source and gate drivers include a large number of shift registers in order to sequentially provide signals.

The gate driver for driving a panel of the TFT LCD provides an addressing pulse through a scanning line in order to drive pixels on the gate line, and the source driver provides image signals through a predetermined signal line to activated TFTs. Here, in order to sequentially provide the image signals through each of the signal lines, shift registers are included within the source driver, and input data is sequentially latched in response to an external clock signal.

For example, when a port image signal is processed in a source driver of a 6-bit, 300-channel TFT LCD, shift registers comprising 100 flip-flops are provided in the source driver.

However, since most TFT LCD source drivers are embodied to be used in a portable device such as a laptop computer, reduction in current consumption is a very important issue. The shift registers, which are built-in the source drivers and formed of a plurality of flip-flops, operate in response to a clock signal, so that current consumption in the shift registers is increased with the clock signal being regularly provided. Also, when the panel of the TFT LCD is driven at a high frequency, the time for which the clock signal remains in a "high" state or a "low" state becomes shorter, so that the clock signal cannot be recognized as an effective clock signal, and a malfunction can occur. Therefore, in order for the flip-flops to recognize a regular "high" state or "low" state, sufficient buffering must be secured. However, this causes an increase in current consumption. In other words, as the frequency of the clock signal driving the panel of the TFT LCD increases, current consumption of the TFT LCD increases.

SUMMARY OF THE INVENTION

To address the above limitations, it is an objective of the present invention to provide a thin film transistor (TFT) liquid crystal device (LCD) driver capable of reducing current consumption by reducing the number of transitions of a clock signal using a double-multiplied signal of an external clock signal as a clock signal.

Accordingly, to achieve the above objective, there is provided a TFT LCD driver comprising a gate driver for driving gate lines of a panel formed of a plurality of transistors and capacitors, and a source driver for driving source lines of the panel. The source driver comprises a shift register portion which includes first through n-th flip-flops, into which a multiplied signal of an external clock signal is input as a clock signal, and input and output terminals of the flip-flops are connected in series and provides a driving pulse signal as an input signal of the first flip-flop in response to the clock signal; a latch clock signal generating portion including first through n-th logic multiplying means for generating first through n-th latch clock signals by logically multiplying the first through n-th middle driving pulse signals generated in the corresponding first through n-th flip-flops by inverted signals of the first through n-th output signals; and a data latching portion for sequentially receiving data signals, and first through n-th latches for latching and outputting the data signals in response to the corresponding first through n-th latch clock signals, respectively.

In particular, the clock signal is input into odd-numbered flip-flops among the first through n-th flip-flops, and inverted signal of the clock signal is input into even-numbered flip-flops among the first through n-th flip-flops. Alternatively, the clock signal is input into even-numbered flip-flops among the first through n-th flip-flops, and the inverted signal of the clock signal is input into odd-numbered flip-flops among the first through n-th flip-flops.

The clock signal is preferably a double-multiplied signal of the external clock signal.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF PREFERRED EMBODIMENTS

Figure 1:
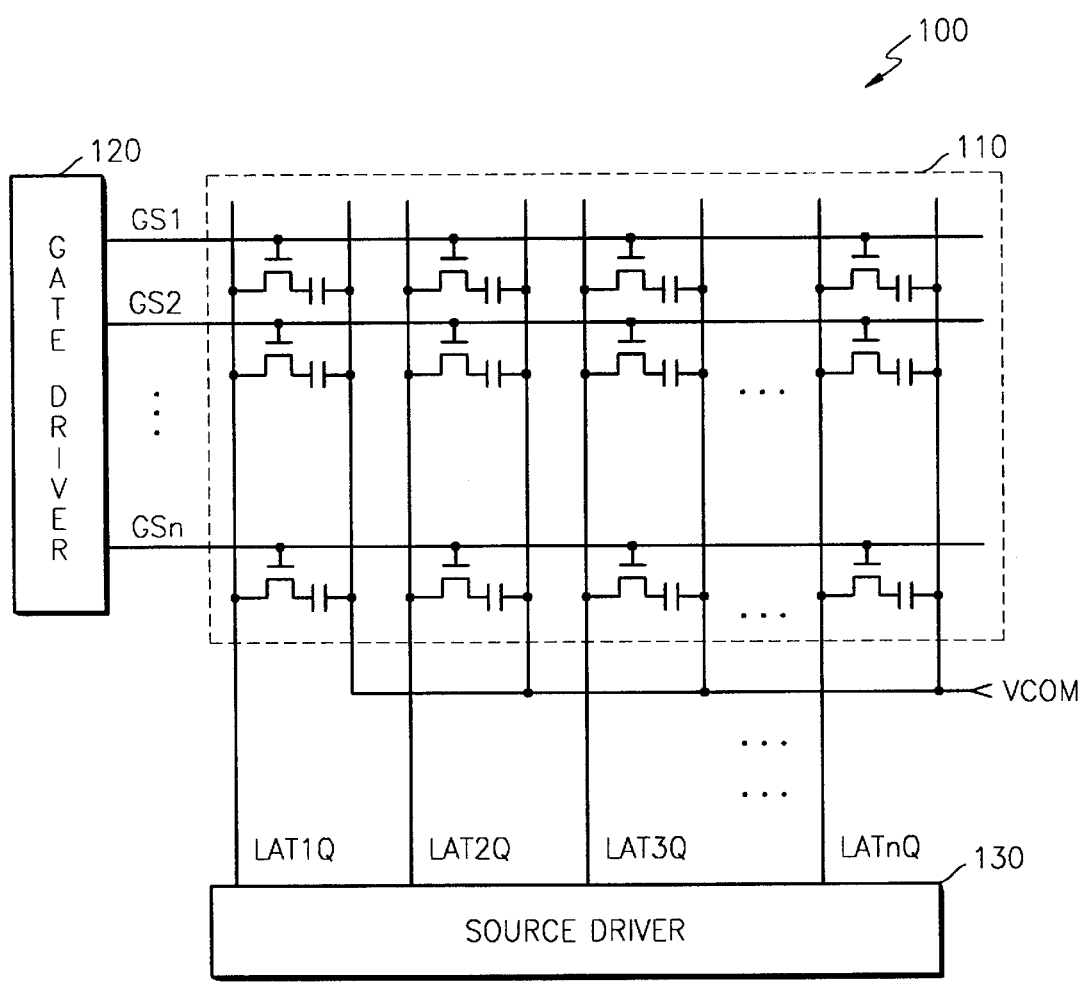
FIG. 1 is a block diagram illustrating a driver of a TFT LCD of the present invention.

To fully understand the present invention, the advantages of operation of the present invention, and the objectives achieved by preferred embodiments of the present invention, reference is made to the accompanying drawings illustrating preferred embodiments of the present invention and contents described in the drawings.

The present invention is now described more fully with reference to the accompanying drawings, in which preferred embodiments of the present invention are shown. The same reference numerals used in different drawings represent the same element.

Referring to FIG. 1, a driver 100 of a thin film transistor (TFT) liquid crystal device (LCD) includes a gate driver 120 for driving gate lines of a panel 110 comprising a plurality of transistors and capacitors, and a source driver 130 for driving source lines of the panel 110.

A reference signal (VCOM) connected to the panel 110 can be connected to ground, or another predetermined voltage.

The driver 100 of FIG. 1 is divided into two kinds of semiconductor devices, a source driver 130 and a gate driver 120. In one example, the source driver 130 receives six bits of color data per pixel displayed on a screen. Color data corresponding to pixels of a gate line (a horizontal line) of the screen is input and latched in the source driver 130. After all of the color data of each of the pixels of a gate line (a horizontal line) of the screen is latched and finally multiplexed into color data of the respective pixels, color signals (LAT1Q, LAT2Q, LAT3Q, ... LATnQ) are simultaneously provided to the corresponding source lines of the panel 110. Hereinafter, n is an integer larger than 1. The operation of the source driver 130 will be described in more detail below with reference to FIG. 2.

The gate driver 120 includes shift registers (not shown) which perform shifting in response to an external clock signal, level shifters (not shown) for shifting levels in response to values shifted in the shift registers, and buffers (not shown) for buffering the shifted levels and outputting the buffered levels as signals (GS1, GS2, ... GSn) for driving the gate lines of the panel 110 of the LCD. That is, the gate driver 120 provides a voltage to the gates of transistors connected to one line of the gate lines of the panel 110 of the LCD, and drives the transistors. Then, color signals (LAT1Q, LAT2Q, LAT3Q, ... LATnQ) of pixels made in the source driver are provided to capacitors through the sources of the activated transistors, and the capacitors are charged. The LCD is turned on by an amount proportional to the charged voltage, and displays colors.

Figure 2:
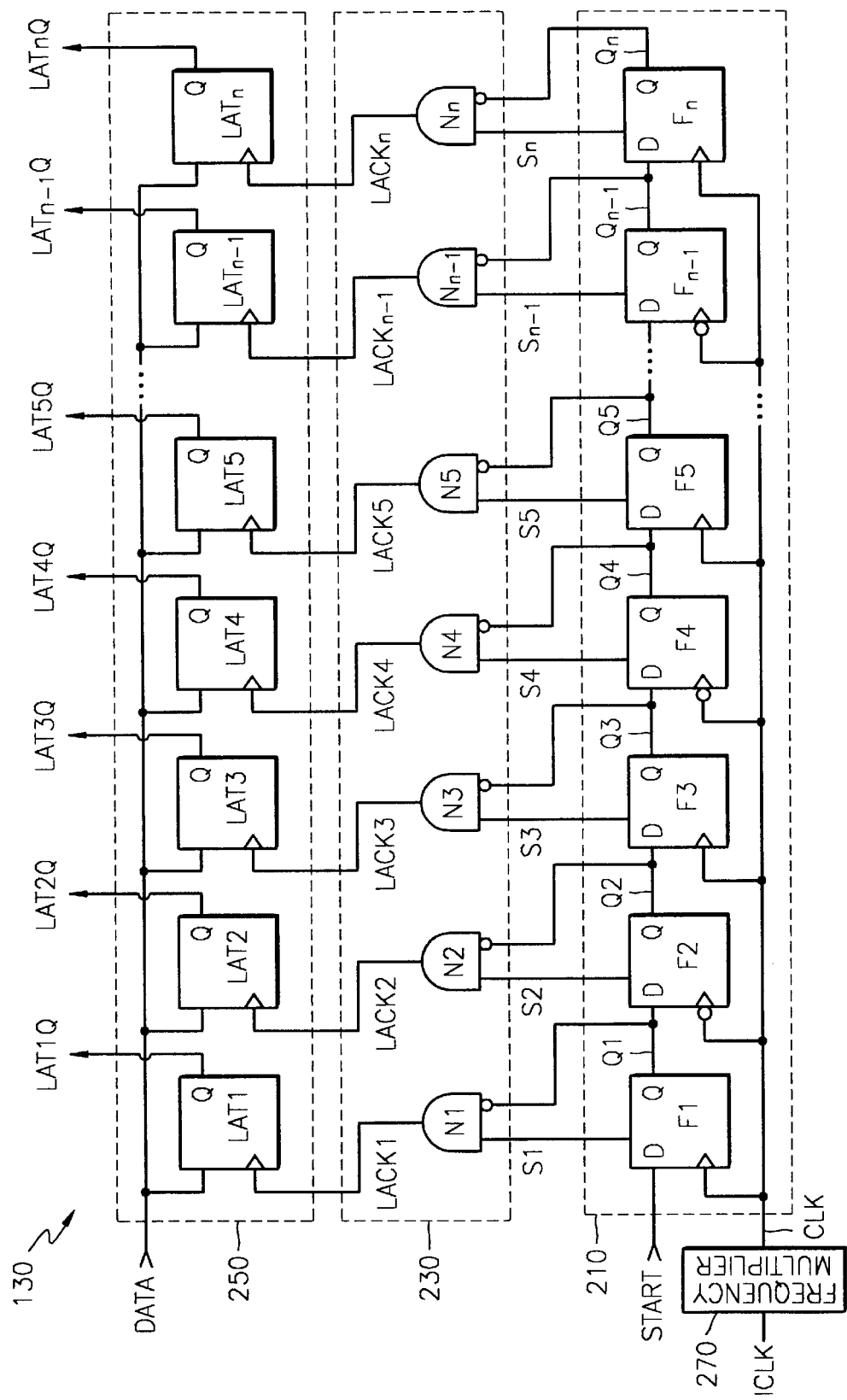
FIG. 2 is a circuit diagram illustrating a source driver shown in FIG. 1.

Referring to FIG. 2, the source diver 130 shown in FIG. 1 is an essential constituent of the present invention, and includes a shift register portion 210, a latch clock signal generating portion 230, a data latching portion 250, and a frequency multiplier 270.

The shift register portion 210 includes first through n-th flip-flops (F1–Fn). The external clock signal ICLK is frequency multiplied by the frequency multiplier 270 and input into each of the flip-flops (F1–Fn). The flip-flops (F1–Fn) are connected in series by connecting their inputs and outputs, and a driving pulse signal (START) is input into the first flip-flop (F1) in response to the clock signal CLK. The clock signal CLK can be used by variously multiplying the external clock signal (ICLK), but in the source driver 130 of FIG. 2, a double-multiplied signal is used. Also, in the source driver 130 of FIG. 2, the clock signal CLK is input to odd-numbered flip-flops among the first through the n-th flip-flops (F1–Fn), while an inverted signal of the clock signal CLK is input to even-numbered flip-flops among the first through the n-th flip-flops (F1–Fn). Alternatively, the clock signal CLK is input to the even-numbered flip-flops among the first through the nth flip-flops (F1–Fn), and the inverted signal of the clock signal (CLK) is input to the odd-numbered flip-flops among the first through the n-th flip-flops (F1–Fn).

The latch clock signal generating portion 230 includes first through n-th logic multiplying means (N1-Nn) for generating first through n-th latch clock signals (LACK1–LACKn) by logically multiplying first through n-th middle driving pulse signals (S1–Sn) output from the corresponding first through n-th flip-flops (F1–Fn) by inverted signals of first through n-th output signals (Q1–Qn). For a clock signal that is not double-multiplied, the structure of the latch clock signal generating portion 230 may be different.

The data latching portion 250 includes first through n-th latches (LAT1–LATn) for receiving data signals (DATA) and for latching and outputting the data signals DATA in response to the corresponding first through n-th latch clock signals (LACK1–LACKn).

The frequency multiplier 270 multiplies the external clock signal ICLK, and outputs the clock signal CLK. In the example embodiment of FIG. 1, the clock signal CLK is a double-multiplied signal.

Figure 3:
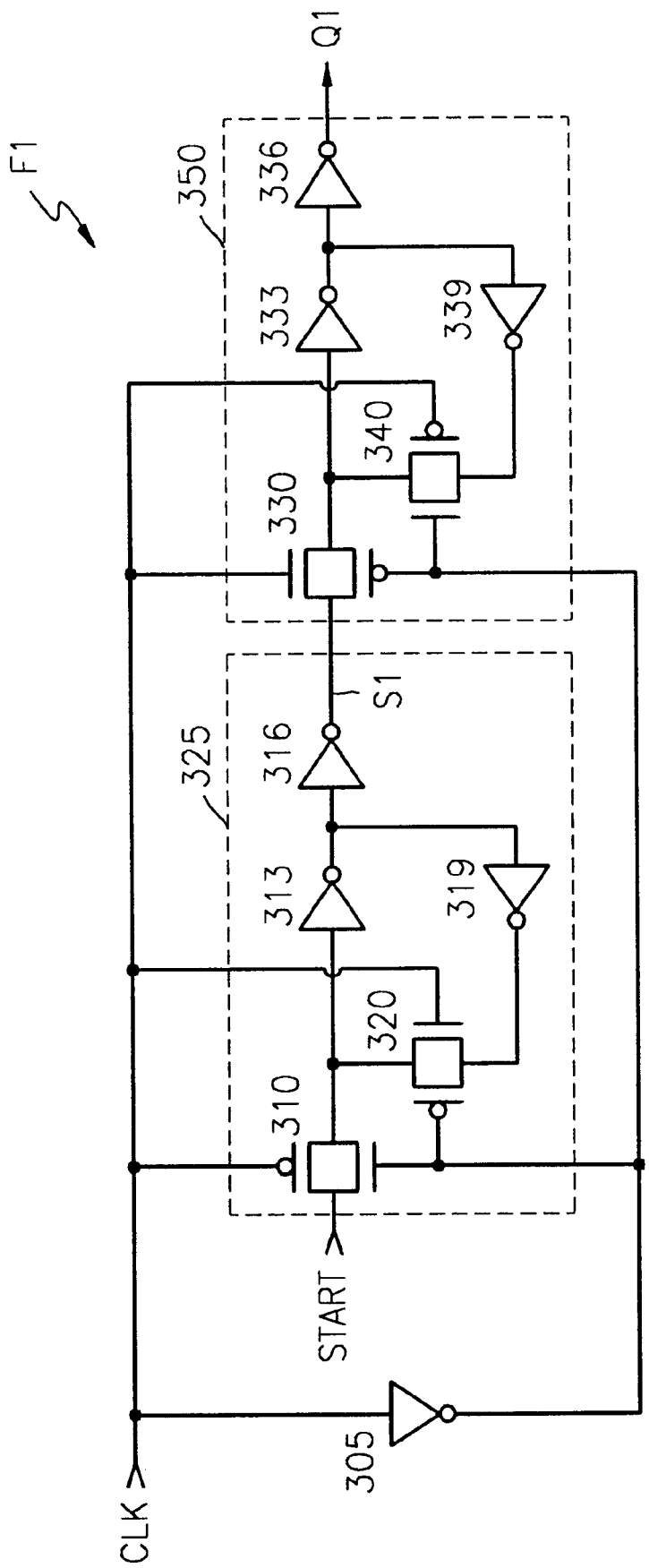
FIG. 3 is a circuit diagram illustrating a structure of a flip-flop of a shift register portion shown in FIG. 2.

In FIG. 3, the structure of the first flip-flop (F1) among the flip-flops (F1-Fn) is illustrated as a representative example of the structure of the other flip-flops (F1–Fn). The first flip-flop (F1) includes an inverter 305 for inverting the clock signal CLK, a master portion 325 for receiving the driving pulse signal START in response to the clock signal CLK and for generating the middle driving pulse signal (S1), and a slave portion 350 for receiving the middle driving pulse signal (S1) in response to the clock signal CLK and generating the output signal (Q1). The slave portion 350 includes transfer gates 330 and 340, and inverters 333, 336 and 339.

Figure 4:
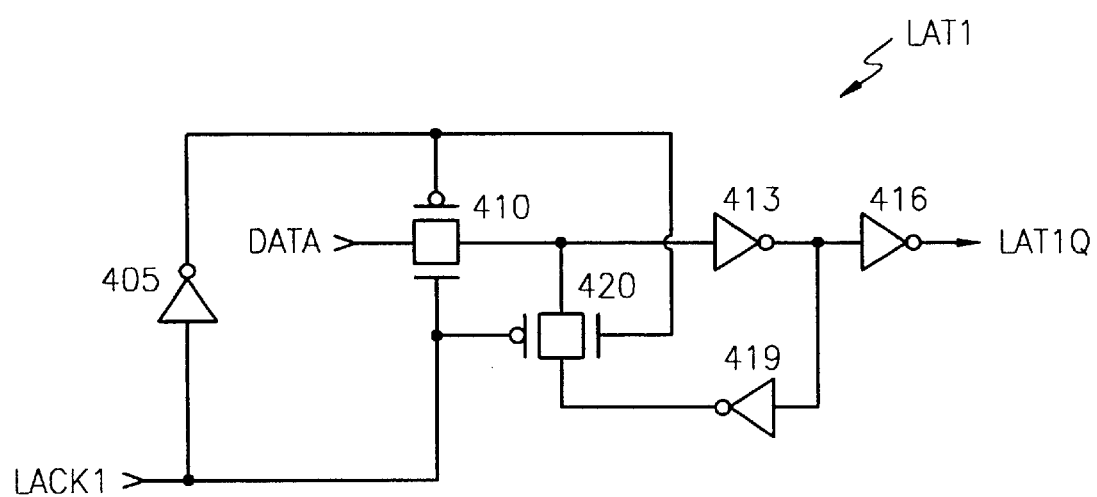
FIG. 4 is a circuit diagram illustrating a structure of a latch of a data latch portion shown in FIG. 2.

In FIG. 4, the structure of the first latch (LAT1) among the latches (LAT1–LATn) is illustrated as a representative example of the structure of the other latches (LAT1–LATn). The first latch (LAT1) includes an inverter 405 for inverting the first latch clock signal (LACK1), transfer gates 410 and 420, and inverters 413, 416 and 419.

Referring to FIGS. 2, 3, and 4, operation of the source driver 130 according to a preferred embodiment of the present invention will be fully described.

The shift register portion 210 sequentially latches the driving pulse signal (START) through the n flip-flops (F1–Fn) which are connected in series by directly connecting their input and output terminals, and generates the first through n-th middle driving pulse signals (S1–Sn) and the first through n-th output signals (Q1–Qn). More particularly, the first flip-flop (F1) of the shift register portion 210 receives the driving pulse signal (START), and generates the first output signal (Q1). The first output signal (Q1) is provided as an input to the second flip-flop (F2). The output signal (Q2) of the second flip-flop (F2) is provided as an input to the third flip-flop (F3), and in the same manner, the output signal (Qn–1) of the n–1-th flip-flop (Fn–1) is provided as an input to the n-th flip-flop (Fn). That is, the driving pulse signal (START) provided as an input to the first flip-flop (F1) is output in response to the clock signal CLK, and provided as an input to the second flip-flop (F2). Here, the clock signal CLK is obtained by double-multiplying the external clock ICLK through the frequency multiplier 170.

The clock signal CLK and the inverted signal of the clock signal CLK are alternately input as a clock input of the first through n-th flip-flops (F1–Fn). That is, if the clock signal CLK is input into odd-numbered flip-flops, the inverted signal of the clock signal CLK is input into even-numbered flip-flops. Alternatively, if the clock signal CLK is input into even-numbered flip-flops, the inverted signal of the clock signal CLK is input into odd-numbered flip-flops.

Referring to FIG. 3, when the transfer gate 310 of the master portion 325 turns on at a falling edge of the clock signal CLK, the driving pulse signal (START) passes through the transfer gate 310 and the inverters 313 and 316 to generate the middle driving pulse signal S1. Since the driving pulse signal passes through the two inverters 313 and 316, the phase is maintained as it is. When the transfer gate 330 of the slave portion 350 turns on at a rising edge of the clock signal CLK, the middle driving pulse signal S1 passes through the transfer gate 330 and the inverters 333 and 336 to generate the first output signal Q11. Here, the output of the inverter 313 of the master portion 325 passes through the inverter 319 and the activated transfer gate 320, and is connected to the input terminal of the inverter 313 and latched. If the clock signal CLK is transferred to a logic low level, the transfer gate 340 of the slave portion 350 turns on, and the output of the inverter 333 is latched.

Since the inverted signal of the clock signal CLK is input as a clock input of the second flip-flop F2, the middle driving pulse signal S2 and the output signal Q2 are generated in the clock phase opposite to that of the operation of the flip-flops described above. Therefore, each of the middle driving pulse signals (Si, i=1-n) and each of the output signals (Qi, i=1-n) go to a logic high level at every rising edge and falling edge, that is, every half period, and are maintained at the high level for one period of the clock signal CLK, and then transferred to a logic low level.

Therefore, the number of transition times of a clock signal is reduced by use of a double-multiplied signal of the external clock signal ICLK, but the data signals DATA are latched with the same timing as the case where the data signals DATA operate directly in response to the external clock signal ICLK as described later.

In the latch clock signal generating portion 230 including the first through n-th logic multiplying means (N1–Nn), the inverted signals of the output signal (Q1–Qn) corresponding to the middle driving pulse signals (S1–Sn) generated in the first through n-th flip-flops (F1–Fn), are provided to the first through n-th logic multiplying means (N1–Nn), and the first through n-th latch clock signals (LACK1–LACKn) are generated. If the clock signal CLK is not a double-multiplied signal, the structure of the latch clock signal generating portion 230 can be changed, and such a structure will be known to those skilled in the art, so that its detailed description will be omitted.

The data latching portion 250 sequentially receives the data signals (DATA) and includes the first through n-th latches (LAT1–LATn) for latching and outputting the data signals (DATA) in response to the corresponding first through n-th latch clock signals (LACK1–LACKn), respectively. Here, the data signals (DATA) are signals including color data for displaying colors on the screen of the LCD. Referring to FIG. 4, when the first latch clock signal (LACK1) is a logic high level, a transmission gate 410 turns on, and when the first latch clock signal (LACK1) is transferred to the logic low level, a transmission gate 420 turns on, so that the first latch (LAT1) receiving the data signals (DATA) continuously latches the data signals (DATA). The second latch (LAT2) continuously latches the data signals (DATA) when the second latch clock signal (LACK2) is transferred to the logic low level. Similarly, the n-th latch continuously latches the data signals (DATA) when the n-th latch clock signal (LACKn) is transferred to the logic low level. The latched data signals (DATA) are used to generate color signals (LAT1Q, LAT2Q, LAT3Q, ... LATnQ), and simultaneously provided to the panel 110 on a line by line basis.

Figure 5:
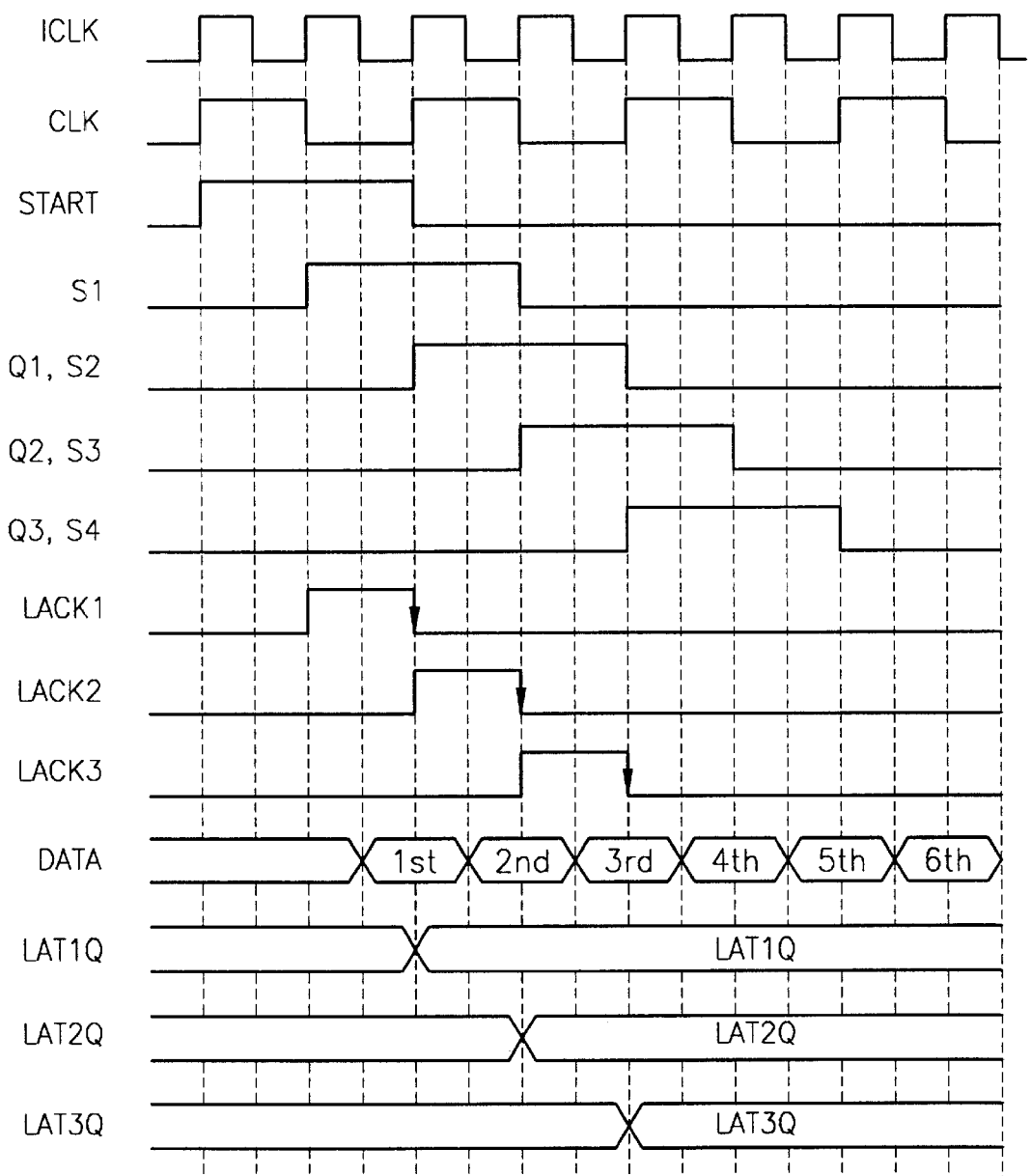
FIG. 5 is a timing chart illustrating the operation of a source driver shown in FIG. 2.

The first through n-th flip-flops (F1–Fn) operate according to the same method. FIG. 5 is a timing diagram showing the operation of the first through third flip-flops (F1–F3) as a representative example of the operation of all flip-flops.

At the falling edge of the clock signal CLK, the first middle driving pulse signal S1 is transitioned to the logic high level in response to the driving pulse signal START, and is transitioned to the logic low level after one period of the clock signal CLK. Since the second flip-flop F2 shown in FIG. 2 operates in response to the inverted signals of the clock signal CLK, the second middle driving pulse signal S2 is transitioned to the logic high level with the first output signal Q1 at the rising edge after a half period from the falling edge of the clock signal CLK having the first middle driving pulse signal S1, and maintained during one period of the clock signal CLK. Since the clock signal CLK is input as it is without inverting the phase, the third middle driving pulse signal S3 is transitioned to the logic high level at the falling edge after a half period from the rising edge of the clock signal CLK having the second middle driving pulse signal S2, and maintained during one period of the clock signal CLK. In the same way, the middle driving pulse signals (Si, i=1-n) and the output signals (Qi, i=1-n) are transitioned to the logic high level for one period of the clock signal CLK at every half period of the clock signal CLK.

Since the first through third latch clock signals (LACK1–LACK3) are generated by logically multiplying the first through third middle driving pulse signals (S1–S3) by the phase inverting signals of the first through third output signals (Q1–Q3), the first through third latch clock signals (LACK1–LACK3) are also transitioned to the logic high level at every half period of the clock signal CLK, maintained for a half period, and then transferred to the logic low level. This operation is performed equally to the other latch clock signals (LACK4–LACKn).

At the falling edge of the first latch clock signal LACK1, the first data signal ($1^{st}$ DATA) is latched, at the falling edge of the second latch clock signal LACK2, the second data signal ($2^{nd}$ DATA) is latched, and in the same way, at the falling edge of the n-th latch clock signal LACKn, the n-th data signal (nth DATA) is latched. Timing of latching the data signals DATA is identical to the case where the source driver operates directly in response to the external clock signal ICLK. That is, there is no change in latching the data signals DATA, and the number of transition times of the clock signal is reduced by use of a double-multiplied signal of the external clock signal ICLK, so that current consumption is likewise reduced. Also, the time of maintaining the "high" state or "low" state of the clock signal CLK becomes longer than the case where the external clock ICLK is directly used, so that there is a reduced possibility of mis-operation.

The TFT LCD driver according to the present invention has an advantage in that current consumption of the TFT LCD driver is reduced by reducing the number of transition times of a clock signal using a double-multiplied signal of the external clock signal as a clock signal.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A thin film transistor (TFT) liquid crystal device (LCD) driver comprising:
   a gate driver for driving gate lines of a panel formed of a plurality of transistors and capacitors; and
   a source driver for driving source lines of the panel, the source driver comprising:
      a shift register portion including first through n-th flip-flops, into which a multiplied signal of an external clock signal is input as a clock signal, wherein input and output terminals of the flip-flops are connected in series and driving pulse signals are provided as an input signal of the first flip-flop in response to the clock signal;
      a latch clock signal generating portion including first through n-th logic multiplying means for generating first through n-th latch clock signals by logically multiplying first through n-th middle driving pulse signals generated in the corresponding first through n-th flip-flops by inverted signals of first through n-th output signals; and a data latching portion for receiving data signals, the data latching portion comprising first through n-th latches for latching and outputting the data signals in response to the corresponding first through n-th latch clock signals.

2. The TFT LCD driver of claim 1, wherein the clock signal is input into odd-numbered flip-flops among the first through n-th flip-flops, and an inverted signal of the clock signal is input into even-numbered flip-flops among the first through n-th flip-flops.

3. The TFT LCD driver of claim 1, wherein the clock signal is input into even-numbered flip-flops among the first through n-th flip-flops, and the inverted signal of the clock signal is input into odd-numbered flip-flops among the first through n-th flip-flops.

4. The TFT LCD driver of claim 1, wherein the clock signal is a double-multiplied signal of the external clock signal.

* * * * *